(12) United States Patent
Aruga et al.

(10) Patent No.: US 6,632,726 B2
(45) Date of Patent: Oct. 14, 2003

(54) FILM FORMATION METHOD AND FILM FORMATION APPARATUS

(75) Inventors: Michio Aruga, Narita (JP); Atsushi Tabata, Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/940,619

(22) Filed: Aug. 29, 2001

(65) Prior Publication Data

US 2002/0028567 A1 Mar. 7, 2002

(30) Foreign Application Priority Data

Aug. 30, 2000 (JP) .......................... P2000-261510

(51) Int. Cl.[7] .......................... H01L 21/20; H01L 21/36
(52) U.S. Cl. .......................... 438/485; 438/729
(58) Field of Search .......................... 438/485, 513, 438/710, 726, 729, 788, 798

(56) References Cited

U.S. PATENT DOCUMENTS 5,803,970 A * 9/1998 Tateyama et al.
6,149,976 A * 11/2000 Matsuki et al.
6,194,037 B1 * 2/2001 Terasaki et al.
6,491,799 B1 * 12/2002 Hause et al.
6,503,818 B1 * 1/2003 Jang \* cited by examiner

*Primary Examiner*—Phuc T. Dang
(74) *Attorney, Agent, or Firm*—Moser, Patterson & Sheridan, L.L.P.

(57) ABSTRACT

To perform a film formation process, source RF power is applied to a coil to generate a plasma in a processing chamber. Subsequently, $O_2$ gas and $SiH_4$ gas are introduced into the processing chamber. Bias RF power is then applied to a support member to cause permeation of a wafer W by the plasma. At the end of the film formation, the application of the bias RF power to the support member is stopped while the $O_2$ gas and the $SiH_4$ gas are kept introduced into the processing chamber. After that, the introduction of the $SiH_4$ gas is stopped, and the introduction of the $O_2$ gas is also stopped. Then, the application of the source RF power to the coil is stopped. This can reduce plasma damage to the substrate to be processed.

18 Claims, 7 Drawing Sheets

FILM FORMATION METHOD AND FILM FORMATION APPARATUS

BACKGROUND OF THE INVENTION

1. Field of the Invention

The present invention relates to a film formation method and film formation apparatus for forming an insulating film on the surface of a substrate to be processed, by generating a plasma in a processing chamber and at the same time introducing a film formation gas into the processing chamber.

2. Related Background Art

A high-density plasma (HDP) type CVD apparatus is available as one film formation apparatus. When a film is to be formed on a semiconductor substrate by using this HDP type CVD apparatus, the semiconductor substrate is first supported on a support member in a processing chamber. Source RF power is then applied to a coil antenna installed in the processing chamber to generate an inductively coupled RF plasma (ICP) in the processing chamber. In addition, a film formation gas is introduced into the processing chamber. Bias RF power is applied to the support member to allow the plasma species generated in the processing chamber permeate the substrate surface. In this manner, an insulating film such as $SiO_2$ is formed on the substrate.

SUMMARY OF THE INVENTION

Recently, as the thickness of a gate oxide film of a MOS transistor decreases to 10 nm or less, this gate oxide film is often destroyed by charge-up in a semiconductor manufacturing apparatus using a plasma. The conventional method of reducing this plasma damage to the gate oxide film is to reduce the potential of a plasma, uniformize a plasma, or control the amount of electric charge injected into a wafer as in an ion implantation apparatus. These techniques are very effective in an etching apparatus and an ion implantation apparatus. However, these countermeasures are still unsatisfactory in an apparatus which forms an insulating film on the surface of a substrate, such as an HDP type CVD apparatus described above.

It is an object of the present invention to provide a film formation method and film formation apparatus capable of reducing plasma damage to a substrate to be processed.

The present inventors made extensive studies and have found the following. That is, when at the end of film formation the introduction of a film formation gas into a processing chamber is stopped while bias RF power is applied to a support member, the plasma density above a substrate to be processed becomes nonuniform owing to the influence of the film formation gas remaining in a pipe. If the application of the bias RF power to the support member is stopped in this state, plasma damage to the substrate readily occurs. On the basis of this finding, the present inventors have completed the present invention.

That is, the present invention is a film formation method of forming an insulating film on the surface of a substrate to be processed supported on a support member in a processing chamber, characterized by comprising the steps of forming a film on the substrate, while a plasma is generated in the processing chamber and a film formation gas is introduced into the processing chamber, by making the plasma permeate the substrate by applying bias RF power to the support member, and stopping the application of the bias RF power to the support member while the film formation gas is kept introduced into the processing chamber, and completing the film formation on the substrate by stopping the introduction of the film formation gas after that.

In the present invention as described above, during the film formation process in which the film formation gas is kept introduced into the processing chamber, the supply flow rate of the film formation gas is so set that the film thickness of an insulating film formed on the surface of a substrate to be processed becomes substantially uniform. Accordingly, the plasma density above the substrate is substantially uniform, and the plasma in this state permeates the surface of the substrate. Therefore, even when the application of the bias RF power is stopped while the film formation gas is kept introduced into the processing chamber, the electric charge balance on the surface of the substrate is maintained in a relatively good condition. This can reduce plasma damage to the substrate.

Preferably, when the film formation gas is introduced into the processing chamber, the film formation gas is supplied toward the surface of the substrate from the upper portion and side portion of the support member. Accordingly, substantially equal amounts of the film formation gas can be supplied to the center and edge of the substrate. This makes it possible to further improve the uniformity of the film thickness of the insulating film formed on the substrate. Consequently, plasma damage to the substrate can be further reduced.

Preferably, a gas containing a silicon-containing gas and an oxidizing gas is used as the film formation gas. In this case, an $SiO_2$ film can be formed as an insulating film on the surface of the substrate.

Preferably, after the application of the bias RF power to the support member is stopped, the introduction of the silicon-containing gas into the processing chamber is stopped, and subsequently the introduction of the oxidizing gas into the processing chamber is stopped. By sequentially stopping the introduction of gases in this manner, the occurrence of nonuniform plasma distribution can be minimized.

For example, $SiH_4$ gas is used as the silicon-containing gas, and $O_2$ gas is used as the oxidizing gas.

Also, the present invention is a film formation apparatus for forming an insulating film on the surface of a substrate to be processed supported on a support member in a processing chamber, characterized by comprising plasma generating means for generating a plasma in the processing chamber, plasma permeation means for making the plasma generated by the plasma generating means permeate the substrate by applying bias RF power to the support member, gas introducing means for introducing the film formation gas into the processing chamber, and control means for controlling the plasma permeation means for stopping the application of the bias RF power to the support member while the film formation gas is kept introduced into the processing chamber, and controlling the gas introducing means for stopping the introduction of the film formation gas after that.

The above-mentioned film formation method can be practiced by thus using the plasma generating means, plasma permeation means, gas introducing means, and control means. Accordingly, plasma damage to the substrate to be processed can be reduced.

Preferably, the gas introducing means comprises a first nozzle formed in the upper portion of the processing chamber to spray the film formation gas toward the surface of the substrate, and a plurality of second nozzles formed in the side portion of the processing chamber to spray the film formation gas toward the surface of the substrate. With this construction, substantially equal amounts of the film formation gas can be supplied to the center and edge of the substrate. Therefore, the film thickness of the insulating film on the substrate becomes more uniform. As a consequence, plasma damage to the substrate can be further reduced.

Preferably, the gas introducing means comprises a silicon-containing gas introduction system for introducing a silicon-containing gas into the processing chamber, and an oxidizing gas introduction system for introducing an oxidizing gas into the processing chamber. In this case, a gas containing the silicon-containing gas and the oxidizing gas is introduced as a film formation gas into the processing chamber.

Preferably, the control means controls the plasma permeation means to stop the application of the bias RF power to the support member, controls the silicon-containing gas introduction system to stop the introduction of the silicon-containing gas into the processing chamber, and then controls the oxidizing gas introduction system to stop the introduction of the oxidizing gas into the processing chamber.

Preferably, the processing chamber comprises a chamber main body in which the support member is placed, and a lid made of an insulating material and mounted in the upper portion of the chamber main body, a coil being attached to the outer surface of the lid, and the plasma generating means generates a plasma in the processing chamber by applying source RF power to the coil. Thus, a plasma can be effectively generated in the processing chamber.

BRIEF DESCRIPTION OF THE DRAWINGS

FIG. 7A is a view showing the results of measurement of damage to a gate oxide film of the antenna TEG shown in FIG. 6, when the supply of a film formation gas was stopped after the application of bias RF power was stopped; and FIG. 7B is a view showing the results of measurement of damage to a gate oxide film of the antenna TEG shown in FIG. 6, when the application of bias RF power was stopped after the supply of a film formation gas was stopped.

DESCRIPTION OF THE PREFERRED EMBODIMENTS

Preferred embodiments of a film formation method and film formation apparatus according to the present invention will be described below with reference to the accompanying drawings.

Figure 1:
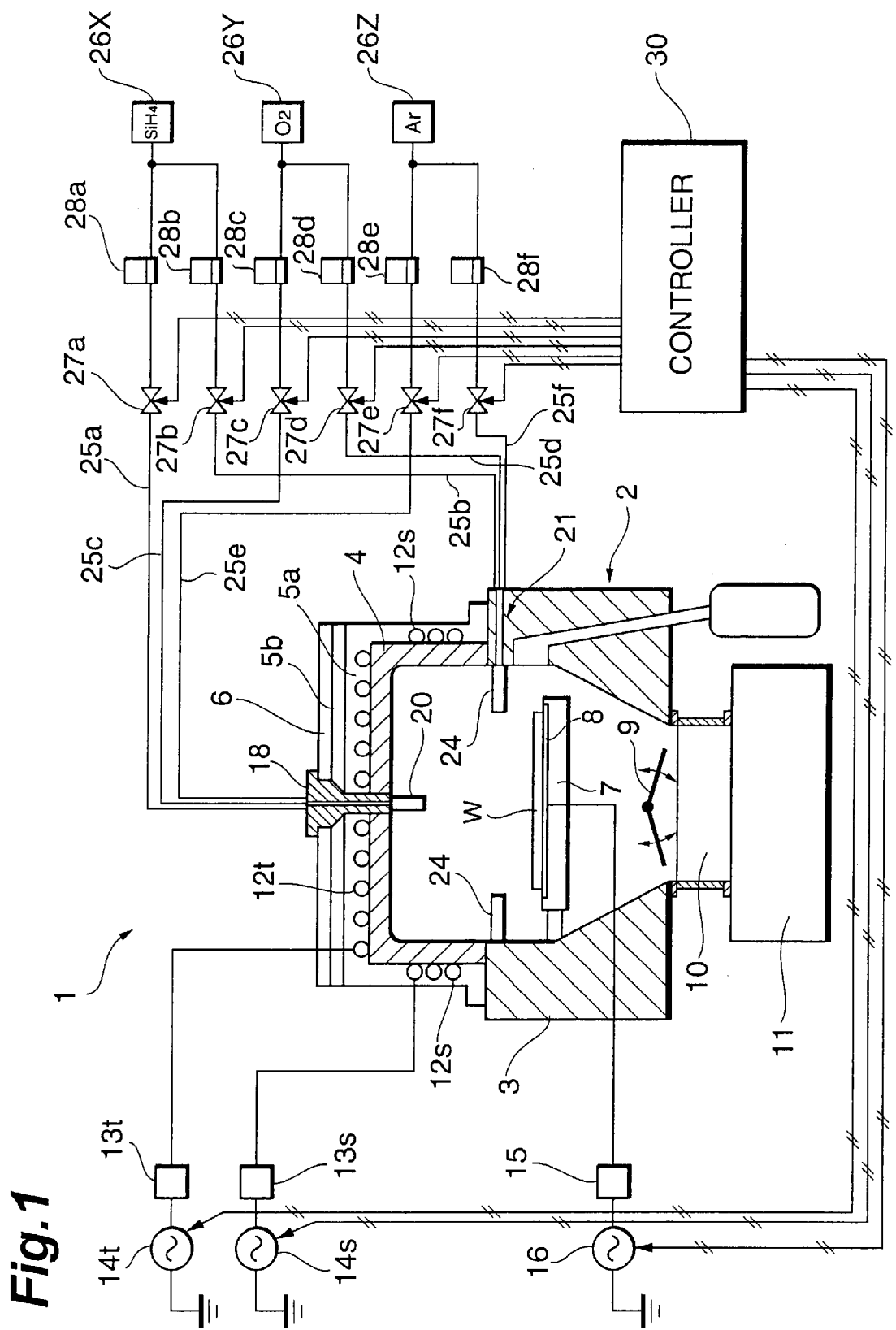
FIG. 1 is a schematic view showing the arrangement of a high-density plasma (HDP) type CVD apparatus as one embodiment of a film formation apparatus according to the present invention.

FIG. 1 is a schematic view showing the arrangement of a high-density plasma (HDP) type CVD apparatus as an embodiment of the film formation apparatus according to the present invention. Referring to FIG. 1, a HDP type CVD apparatus 1 has a processing chamber 2. This processing chamber 2 includes a chamber main body 3 and a domed lid 4 mounted on the chamber main body 3. The lid 4 is made of an insulating material such as ceramic. On this lid 4, a heating plate 5a and a cooling plate 5b for setting the dome temperature, and a support plate 6 are arranged.

In the processing chamber 2, a support member 7 for supporting a wafer W as a substrate to be processed is set. An electrostatic chuck 8 for fixing the wafer W is attached to this support member 7. Also, a throttle valve 9 is placed below the support member 7 in the processing chamber 2. In the lower portion of this processing chamber 2, a turbo molecular pump 11 is set via a gate valve 10 to evacuate the processing chamber 2.

A top coil $12t$ and a side coil $12s$ are attached to the outer surfaces of the lid 4. These coils $12t$ and $12s$ are connected to RF generators $14t$ and $14s$ via matching networks $13t$ and $13s$, respectively. These RF generators $14t$ and $14s$ apply source RF power to the coils $12t$ and $12s$, thereby generating a plasma in the processing chamber 2. Also, a RF generator 16 is connected to the support member 7 via a matching network 15. This RF generator 16 applies bias RF power to the support member 7. Consequently, the plasma generated in the processing chamber 2 permeates the surface of the wafer W.

The coils $12t$ and $12s$, the matching networks $13t$ and $13s$, and the RF generators $14t$ and $14s$ construct a plasma generating means for generating a plasma in the processing chamber 2. Also, the matching network 15 and the RF generator 16 construct a plasma permeation means for making the plasma generated by the plasma generating means permeate a substrate to be processed.

A gas introduction portion 18 for introducing a film formation gas downward into the processing chamber 2 is formed in the upper portion of the processing chamber 2. The film formation gas is a gas mixture of silane ($SiH_4$) gas as a silicon-containing gas, oxygen ($O_2$) gas as an oxidizing gas, and argon (Ar) gas as an inert gas.

Figure 2:
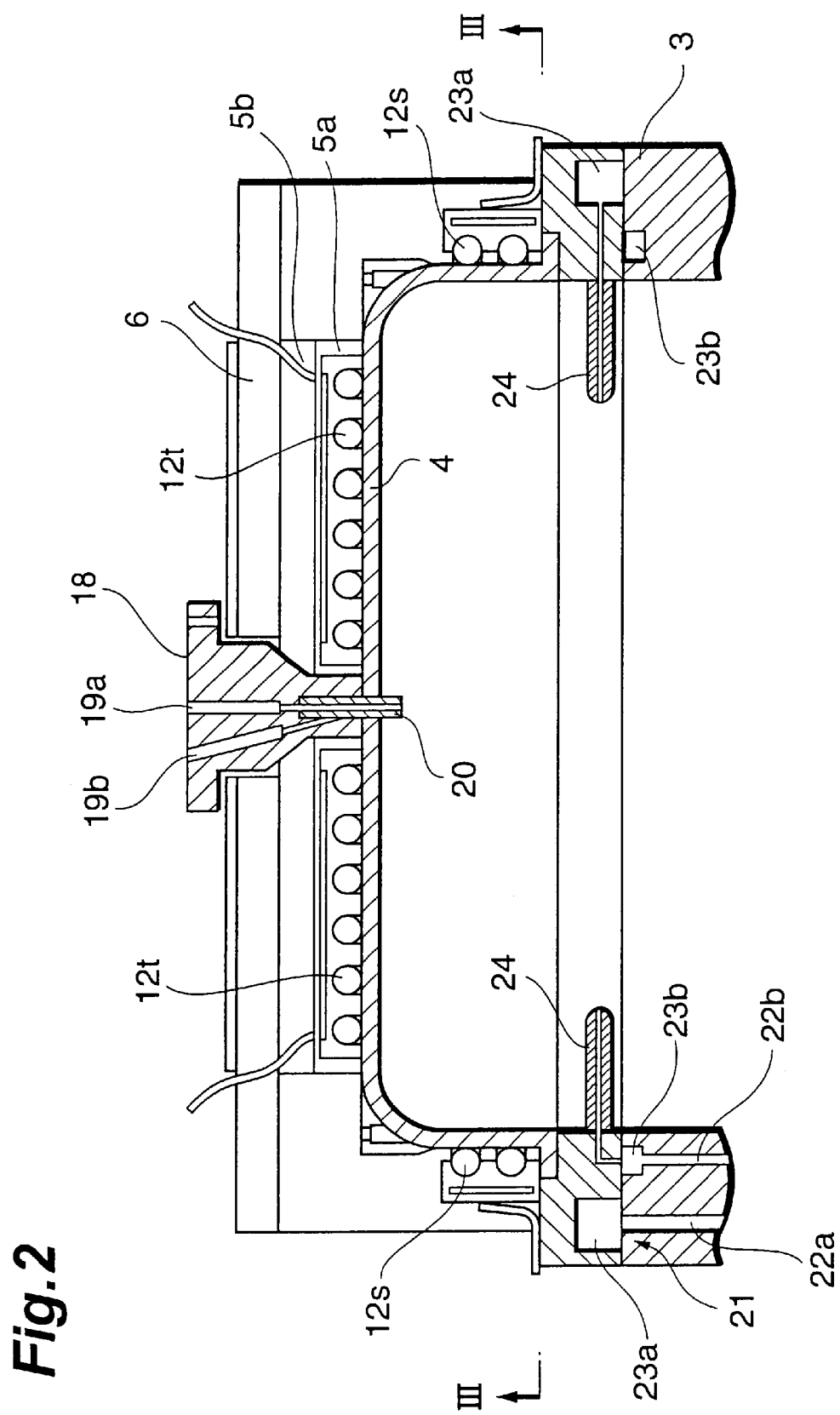
FIG. 2 is an enlarged sectional view showing the upper portion of a processing chamber shown in FIG. 1.

As shown in FIGS. 1 and 2, the gas introduction portion 18 has two gas passages 19a and 19b having gas inlets, and a top nozzle (first nozzle) 20 communicating with these gas passages 19a and 19b and projecting downward. The gas passage 19a is a supply passage for $SiH_4$ gas and Ar gas, and the gas passage 19b is a supply passage for $O_2$ gas. The top nozzle 20 is formed immediately above the support member 7 and efficiently sprays gases from the gas passages 19a and 19b toward a central portion of a wafer. Note that the top nozzle 20 need only be installed above the support member 7, and that a plurality of top nozzles 20 can also be formed.

Figure 3:
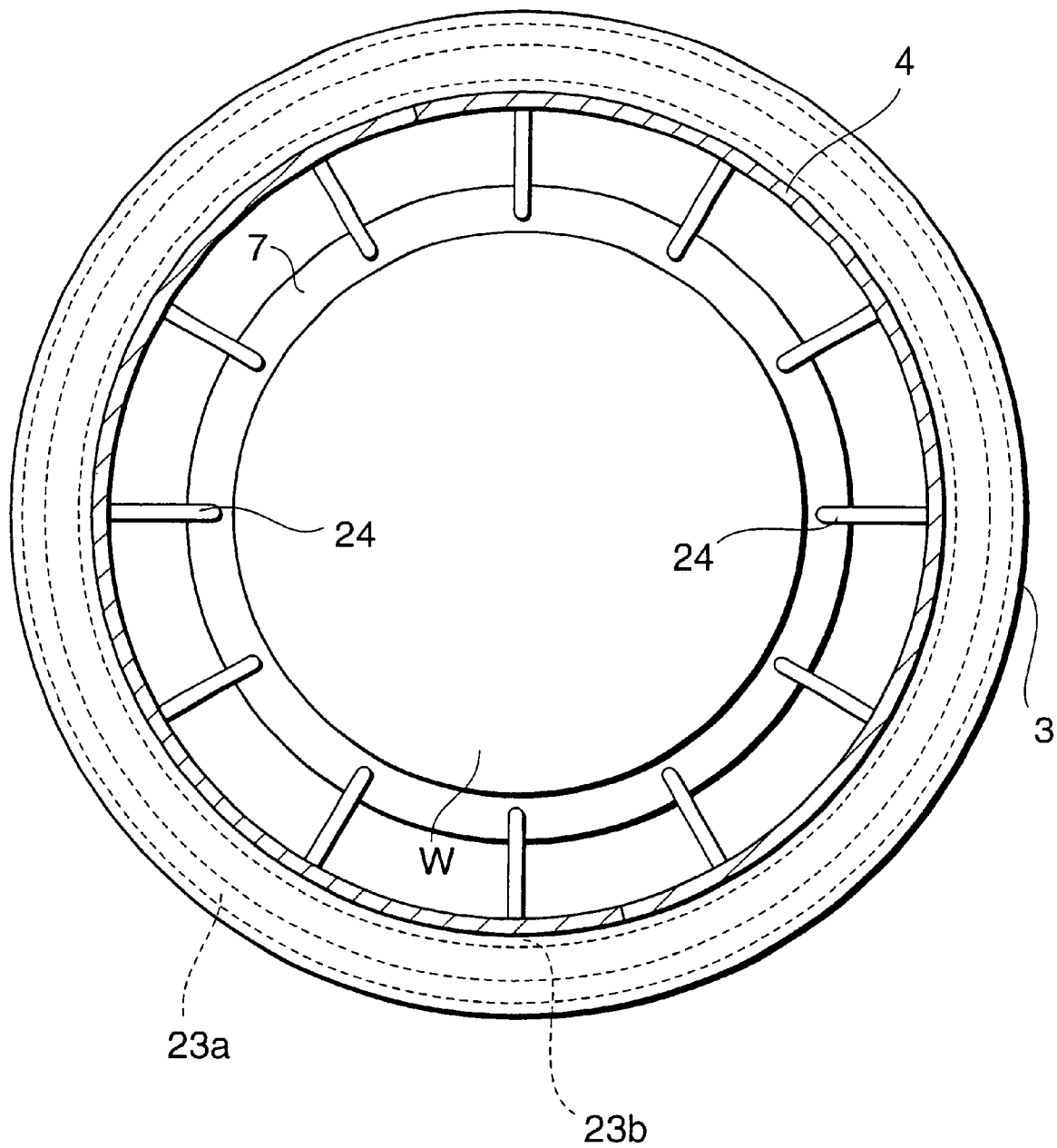
FIG. 3 is a sectional view taken along a line III—III in FIG. 2.

A gas introduction portion 21 for introducing a film formation gas sideways into the processing chamber 2 is formed in the upper portion of the side wall of the chamber main body 3. As shown in FIGS. 2 and 3, this gas introduction portion 21 has gas passages 22a and 22b having gas inlets, gas supply rings 23a and 23b communicating with these gas passages 22a and 22b, respectively, and a plurality of (in this embodiment, 12) side nozzles (second nozzles) 24 projecting inside the chamber main body 3. $SiH_4$ gas and Ar gas are introduced to the gas passage 22a, and $O_2$ gas is introduced to the gas passage 22b.

The side nozzles 24 are divided into $SiH_4$ gas nozzles and $O_2$ gas nozzles. The side nozzles 24 communicating with the gas supply rings 23a are SiH$_4$ gas nozzles; the side nozzles 24 communicating with the gas supply ring 23b are O$_2$ gas nozzles. These side nozzles 24 are so constructed as to spray gases from the gas supply rings 23a and 23b toward the wafer edge.

Referring back to FIG. 1, the gas introduction portions 18 and 21 described above are connected to gas supply sources 26X to 26Z via gas supply lines 25a to 25f. The gas supply source 26X is an SiH$_4$ gas supply source, the gas supply source 26Y is an O$_2$ gas supply source, and the gas supply source 26Z is an Ar gas supply source. The gas supply lines 25a to 25f have open/close valves 27a to 27f for turning on/off the supply of gases to the gas introduction portions 18 and 21, and mass flow controllers (MFCs) 28a to 28f for adjusting the flow rates of gases supplied to the gas introduction portions 18 and 21.

The gas introduction portion 18, the gas passages 19a and 19b, the top nozzle 20, the gas introduction portion 21, the gas passages 22a and 22b, the gas supply rings 23a and 23b, the side nozzles 24, the gas supply lines 25a to 25d, the gas supply sources 26X and 26Y, the open/close valves 27a to 27d, and the MFCs 28a to 28d construct a gas introducing means for introducing a film formation gas into the processing chamber 2.

The main parts of this HDP type CVD apparatus are controlled by control signals from a controller (control means) 30. This controller 30 so controls the RF generators 14t and 14s as to generate a plasma in the processing chamber 2, and so controls the RF generator 16 as to cause permeation of the wafer W by the plasma. The controller 30 also controls the open/close valves 27a to 27f so as to supply gases from the gas supply sources 26X to 26Z into the processing chamber 2. Furthermore, although not shown, the controller 30 controls the MFCs 28a to 28f, controls a wafer transfer robot (not shown) for loading and unloading the wafer W, and controls the throttle valve 9 and the gate valve 10 so as to adjust the internal pressure of the processing chamber 2.

Figure 4:
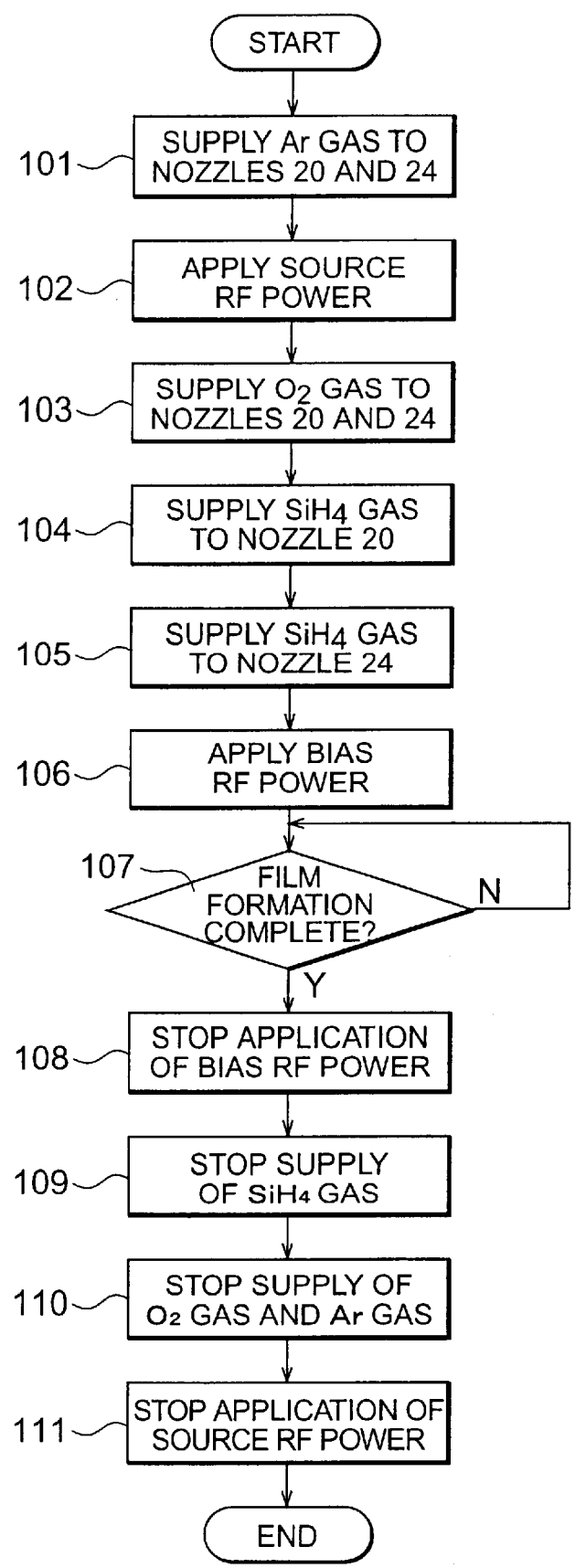
FIG. 4 is a flow chart showing the procedure of gas supply control and RF application control performed by a controller shown in FIG. 1.

FIG. 4 is a flow chart showing details of the procedure by which the controller 30 controls the RF generators 14t, 14s, and 16 and the open/close valves 27a to 27f. A film formation method of the HDP type CVD apparatus 1 will be described below by using this flow chart.

First, the gate valve 10 is opened, and the processing chamber 2 is evacuated by the turbo molecular pump 11 with the throttle valve 9 open at a predetermined angle. The controller 30 controls the open/close valves 27e and 27f to supply Ar gas from the gas supply source 26Z to the nozzles 20 and 24 (step 101 in FIG. 4). Consequently, the Ar gas is introduced into the processing chamber 2 to reduce the internal pressure of the processing chamber 2 to a predetermined value.

After a predetermined time has elapsed, the controller 30 controls the RF generators 14t and 14s to apply source RF power having a frequency of, e.g., 2.0 MHz to the coils 12t and 12s (step 102 in FIG. 4). During film formation, the RF power applied to the top coil 12t is, e.g., 1.3 KW, and the RF power applied to the side coil 12s is, e.g., 3.1 KW. In this way, a plasma is generated in the processing chamber 2.

The electrostatic chuck 8 is turned on to fix the wafer W loaded by the wafer transfer robot (not shown) to the support member 7. Subsequently, the controller 30 controls the open/close valves 27c and 27d to supply O$_2$ gas from the gas supply source 26Y to the nozzles 20 and 24 (step 103 in FIG. 4). Consequently, the O$_2$ gas is introduced into the processing chamber 2, and the surface of the wafer W is heated by the heat of the plasma.

After a predetermined time has elapsed, the controller 30 controls the open/close valve 27a to supply SiH$_4$ gas from the gas supply source 26X to the top nozzle 20 (step 104 in FIG. 4). The controller 30 then controls the open/close valve 27b to supply this SiH$_4$ gas from the gas supply source 26X to the side nozzles 24 (step 105 in FIG. 4). Thus, the SiH$_4$ gas is introduced into the processing chamber 2 to start a process of forming a film on the wafer W. That is, SiH$_4$ or O$_2$ which is ionized into ions or radicals reaches the wafer W to form a silicon oxide film SiO$_2$ on the wafer surface.

The SiH$_4$ gas is supplied to the top nozzle 20 before being supplied to the side nozzles 24 in order to prevent plasma damage which readily occurs in the initial stages of film formation. That is, during film formation, the flow rate of SiH$_4$ gas supplied to the side nozzles 24 is made larger than that of SiH$_4$ gas supplied to the top nozzle 20, so that the film thickness of the SiO$_2$ film formed on the surface of the wafer W becomes uniform. When this is done, however, in the initial stages of film formation, the film thickness of an insulating film formed on the wafer edge often becomes larger than that of the film in the wafer center owing to a conductance difference between the pipes. In this case, the electric charge balance on the wafer worsens, so plasma damage easily occurs on the gate oxide film. Therefore, the SiH$_4$ gas supply timings are set as described above. As a consequence, the film thickness of the insulating film on the wafer edge becomes equal to or smaller than that in the wafer center in the initial stages of film formation. This can reduce plasma damage occurring in the initial stages of film formation.

After an elapse of a predetermined time, the controller 30 controls the RF generator 16 to apply bias RF power having a frequency of, e.g., 13.6 MHz to the support member 7 (step 106 in FIG. 4). This RF power is, e.g., 3.5 KW. This accelerates the transfer of the plasma species generated by the RF generators 14t and 14s to the wafer W, advancing the film formation on the wafer W.

After that, whether the film formation process of the wafer W is complete is checked in accordance with whether a predetermined time has elapsed (step 107 in FIG. 4). When it is determined that the film formation process is complete, the controller 30 controls the RF generator 16 to stop the application of the bias RF power to the support member 7 (step 108 in FIG. 4).

Subsequently, the controller 30 controls the open/close valves 27a and 27b to stop the supply of the SiH$_4$ gas (step 109 in FIG. 4). The electrostatic chuck 8 is turned off, and the wafer W is unloaded from the processing chamber 2 by the wafer transfer robot (not shown). Also, the controller 30 controls the open/close valves 27c to 27f to stop the supply of the O$_2$ gas and the Ar gas (step 110 in FIG. 4). The controller 30 then controls the RF generators 14t and 14s to stop the application of the source RF power to the coils 12t and 12s (step 111 in FIG. 4). In this manner, the wafer film formation process is completed.

Figure 5A:
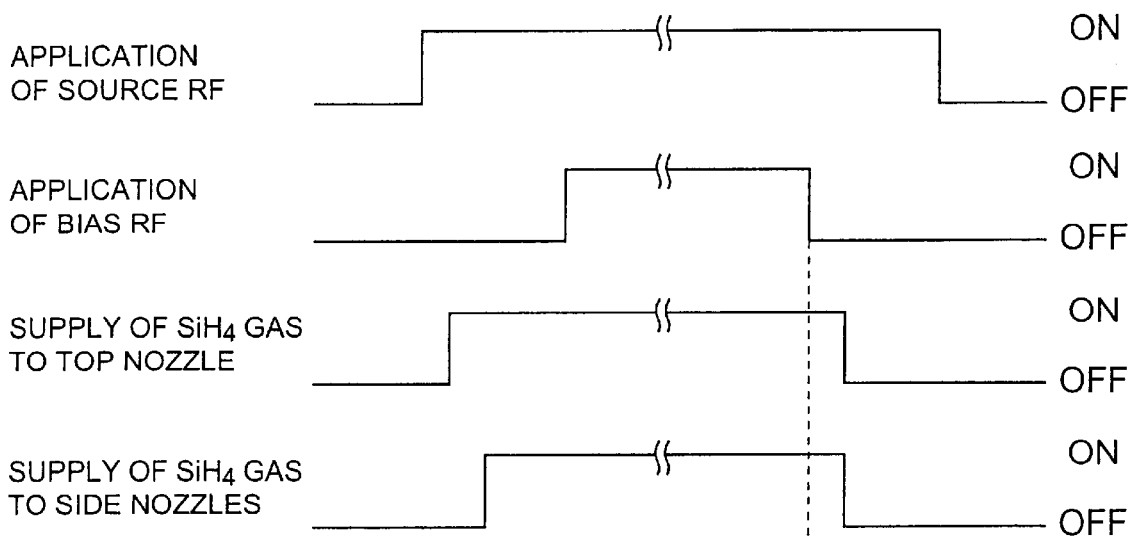
FIG. 5A is a timing chart showing timings at which the supply of a film formation gas to a nozzle is stopped after the application of bias RF power is stopped.
Figure 5B:
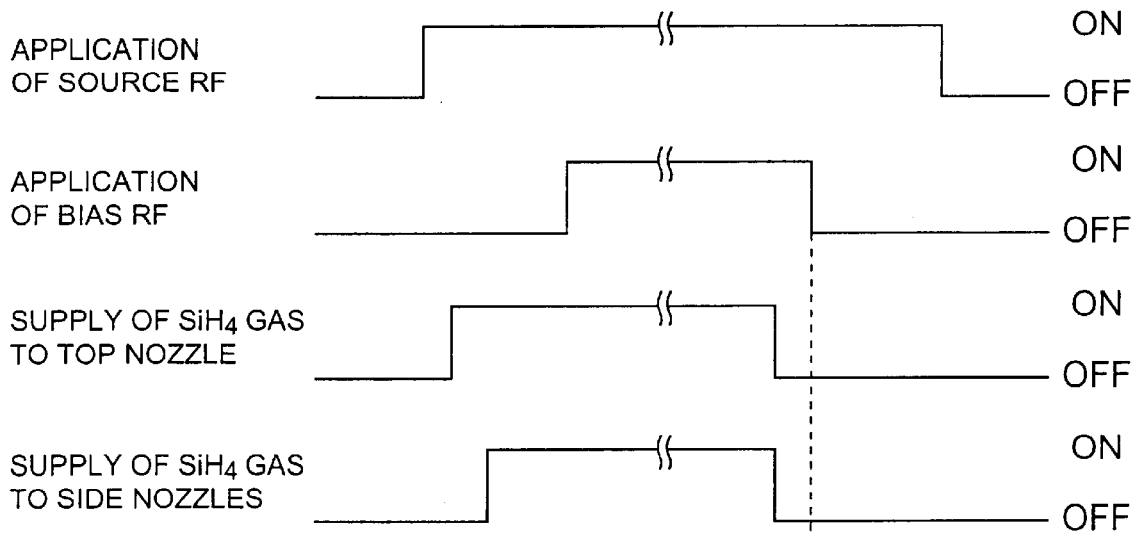
FIG. 5B is a timing chart showing timings at which the application of bias RF power is stopped after the supply of a film formation gas to a nozzle is stopped.

In this film formation process, if the application of the bias RF power to the support member 7 is stopped after the supply of the SiH$_4$ gas to the nozzles 20 and 24 is stopped at the end of the film formation as shown in FIG. 5B, the following inconvenience takes place.

That is, in this structure in which the SiH$_4$ gas is supplied to the wafer W from the upper portion and side portion of the processing chamber 2, the piping conductance and SiH$_4$ gas supply flow rate of the SiH$_4$ gas supply system (gas supply line 25a) of the top nozzle 20 are different from those of the supply system (gas supply line 25b) of the side nozzles 24.

When the supply of the SiH$_4$ gas is stopped, therefore, these differences make the amount of SiH$_4$ gas remaining in the piping of the gas supply line 25b larger than that remaining in the piping of the gas supply line 25a. This makes the plasma density above the wafer edge higher than that above the wafer center. If ions permeate the wafer W while the plasma density is thus nonuniform, the electric charge balance on the surface of the wafer W worsens. Plasma damage to the wafer W is easily induced especially when the application of the bias RF power to the support member 7 is turned on/off. Accordingly, if the application of the bias RF power to the support member 7 is stopped while the electric charge balance on the surface of the wafer W is nonuniform, charged particles readily move to the wafer W. As a consequence, plasma damage occurs on the gate oxide film.

By contrast, in this embodiment as shown in FIG. 5A, the application of the bias RF power to the support member 7 is stopped while the SiH$_4$ gas is kept supplied to the nozzles 20 and 24, and the supply of the SiH$_4$ gas is stopped after that. This can alleviate the inconvenience as described above.

More specifically, while the SiH$_4$ gas is kept supplied, the flow rates of the SiH$_4$ gas supplied to the nozzles 20 and 24 are so set that the film thickness of the insulating film formed on the surface of the wafer W becomes uniform as described above. Hence, the plasma density above the wafer W is almost uniform. Since the ions uniformly permeate the surface of the wafer W in this state, the electric charge balance on the surface of the wafer W is relatively good. Accordingly, even when the application of the bias RF power is stopped in this state, the electric charge balance on the surface of the wafer W is kept in a good condition, so charged particles do not easily move in the wafer W. This reduces plasma damage to the gate oxide film.

Figure 6:
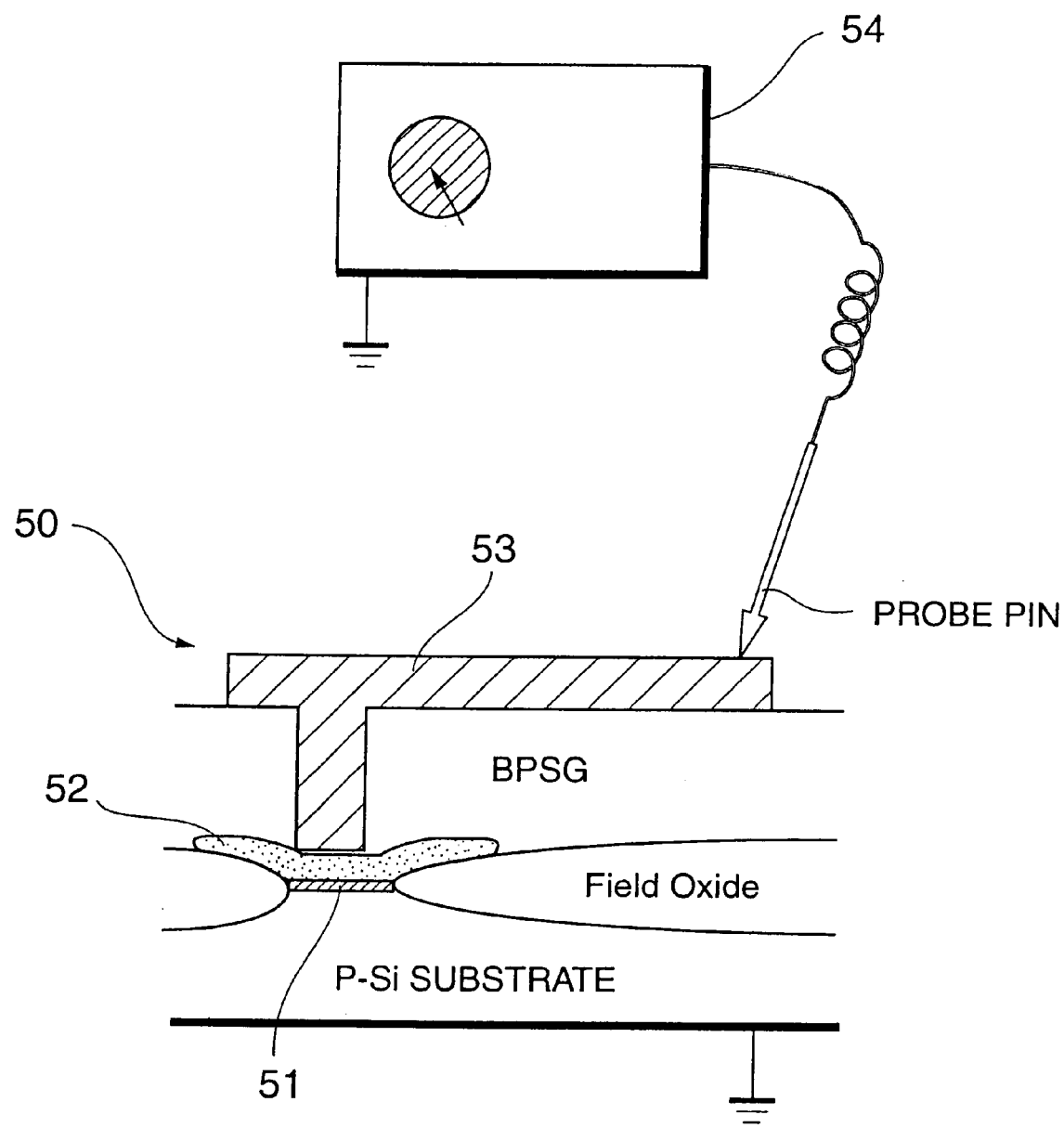
FIG. 6 is a view showing an antenna TEG used in the test of a film formation method according to the present invention.

FIG. 6 shows a test element group (TEG) used in the test of the film formation method according to the present invention. Referring to FIG. 6, a TEG 50 is an antenna TEG including a 40-Å thick gate oxide film 51, a polysilicon gate 52, and an aluminum antenna 53 having an antenna ratio of 20 K. A wafer in which a plurality of such antenna TEGs 50 were incorporated over the whole body was prepared. The voltage applied to the wafer was gradually raised to a maximum of 4.2 V, and the voltage at which the gate oxide film 51 was destroyed was measured by using an IC tester 54. The measurement results are shown in FIGS. 7A and 7B.

Figures 7A, 7B:
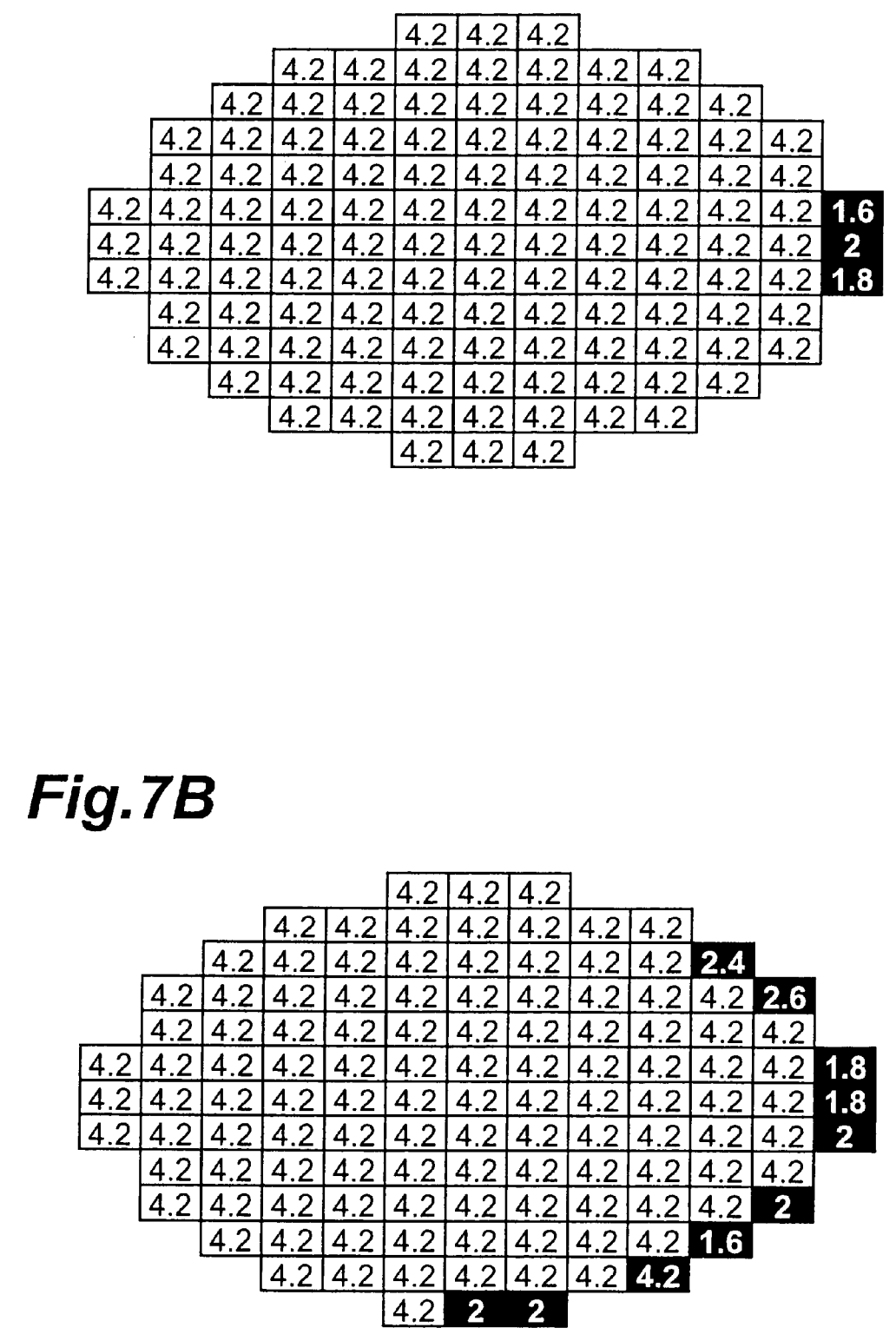

FIG. 7A shows the results when the supply of the SiH$_4$ gas was stopped after the application of the bias RF power was stopped. FIG. 7B shows the results when the application of the bias RF power was stopped after the supply of the SiH$_4$ gas was stopped. Black portions represent defective portions on the wafer where the gate oxide film 51 was damaged.

As shown in FIG. 7B, the damage rate was 9% when the application of the bias RF power was stopped after the supply of the SiH$_4$ gas was stopped. In contrast, as shown in FIG. 7A, the damage rate was 2% when the supply of the SiH$_4$ gas was stopped after the application of the bias RF power was stopped. This indicates that destruction of the gate oxide film 51 was considerably reduced.

Preferred embodiments of the film formation method and film formation apparatus according to the present invention have been described above. However, the present invention is, of course, not restricted to the above embodiments. For example, in the above embodiments, a gas mixture of SiH$_4$ gas as a silicon-containing gas, O$_2$ gas as an oxidizing gas, and Ar gas as an inert gas is used as a film formation gas. However, the film formation gas is not particularly limited to such a gas. For example, it is also possible to use SiF$_4$ gas or SiHCl$_3$ gas as a silicon-containing gas, and NO gas, N$_2$O gas, or NO$_2$ gas as an oxidizing gas. Furthermore, an insulating film formed on the surface of the wafer W is not limited to a silicon oxide film SiO$_2$ as described above, but can be a silicon nitride film such as Si$_3$N$_4$. When this is the case, a gas mixture containing a silicon-containing gas and a nitriding gas such as N$_2$ or NH$_3$ is used as a film formation gas.

In the above embodiments, the top nozzle 20 and the side nozzles 24 are installed in the processing chamber 2 to supply a film formation gas to the wafer W from the upper portion and side portion of the processing chamber 2. However, the present invention is also applicable to a film formation apparatus in which the processing chamber 2 has only one of the top nozzle and the side nozzles.

Furthermore, the above embodiments use an HDP type CVD apparatus. However, the film formation apparatus of the present invention can be applied to any apparatus provided that the apparatus forms a film, while a plasma is generated in a processing chamber and a film formation gas is introduced into the processing chamber, by making the plasma permeate a substrate to be processed by applying bias RF power to a support member.

What is claimed is:

1. A method of forming an insulating film on a surface of a substrate supported on a support member in a processing chamber, comprising:
   generating a plasma in the processing chamber by applying RF power from a first RF generator;
   forming a film on the substrate, while a film formation gas is introduced into the processing chamber, by applying bias RF power from a second RF generator to the support member; and
   stopping the application of the bias RF power to the support member while the film formation gas is kept introduced into the processing chamber, and completing the film formation on the substrate by stopping the introduction of the film formation gas thereafter.

2. A method according to claim 1, wherein when the film formation gas is introduced into the processing chamber, the film formation gas is supplied toward the surface of the substrate from the upper portion and side portion of the support member.

3. A method according to claim 1, wherein a gas containing a silicon-containing gas and an oxidizing gas is used as the film formation gas.

4. A method according to claim 3, wherein after the application of the bias RF power to the support member is stopped, the introduction of the silicon-containing gas into the processing chamber is stopped, and subsequently the introduction of the oxidizing gas into the processing chamber is stopped.

5. A method according to claim 3, wherein SiH$_4$ gas is used as the silicon-containing gas, and O$_2$ gas is used as the oxidizing gas.

6. An apparatus for forming an insulating film on a surface of a substrate supported on a support member in a processing chamber, comprising:
   plasma generating means for generating a plasma in said processing chamber by applying RF power from a first RF generator;
   plasma permeation means for making the plasma generated by said plasma generating means permeate the substrate by applying bias RF power from a second RF generator to said support member;
   gas introducing means for introducing the film formation gas into said processing chamber; and control means for controlling said plasma permeation means to stop the application of the bias RF power to said support member while the film formation gas is kept introduced into said processing chamber, and controlling said gas introducing means to stop the introduction of the film formation gas thereafter.

7. An apparatus according to claim 6, wherein said gas introducing means comprises a first nozzle formed in the upper portion of said processing chamber to spray the film formation gas toward the surface of the substrate, and a plurality of second nozzles formed in the side portion of said processing chamber to spray the film formation gas toward the surface of the substrate.

8. An apparatus according to claim 6, wherein said gas introducing means comprises a silicon-containing gas introduction system for introducing a silicon-containing gas into said processing chamber, and an oxidizing gas introduction system for introducing an oxidizing gas into said processing chamber.

9. An apparatus according to claim 8, wherein said control means sequentially stops the application of the bias RF power to said support member, stops the introduction of the silicon-containing gas into said processing chamber, and then stops the introduction of the oxidizing gas into said processing chamber.

10. An apparatus according to claim 6, wherein said processing chamber comprises a chamber main body having said support member disposed therein, a lid made of an insulating material and mounted in the upper portion of said chamber main body, a coil being attached to the outer surface of said lid, and said plasma generating means generates the plasma in said processing chamber by applying the RF power from the first RF generator to said coil.

11. A method of forming an insulating film on a surface of a substrate supported on a support member in a processing chamber, comprising:

applying a bias RF power to the support member while a plasma is generated in the processing chamber and a film formation gas containing a silicon-containing gas and an oxidizing gas is introduced into the processing chamber; and stopping the application of the bias RF power to the support member while the formation gas is continued to be introduced into the processing chamber;

wherein after the application of the bias RF power to the support member is stopped, the introduction of the silicon-containing gas into the processing chamber is stopped, and subsequently the introduction of the oxidizing gas into the processing chamber is stopped.

12. An apparatus for forming an insulating film on the surface of a substrate supported on a support member in a processing chamber, comprising:

means for generating a plasma in said processing chamber;

means for making the plasma permeate the substrate by applying a bias RF power to said support member;

means for introducing a silicon-containing gas into the processing chamber;

means for introducing an oxidizing gas into the processing chamber; and means for controlling the RF bias, the silicon-containing gas, and the oxidizing gas, wherein said means for controlling sequentially stops the application of the bias RF power to said support member, stops the introduction of the silicon-containing gas into said processing chamber, and then stops the introduction of the oxidizing gas into said processing chamber.

13. The method of claim 1, wherein applying the RF power from the first RF generator comprises applying the RF power to a lid disposed on the chamber.

14. The method of claim 13, wherein applying the RF power from the first RF generator comprises applying the RF power to at least one coil disposed on the lid.

15. The method of claim 1, further comprising stopping the application of RF power from the first RF generator after the introduction of the film formation gas is stopped.

16. The apparatus of claim 6, wherein the RF power from the first RF generator is applied to a lid disposed on the chamber.

17. The apparatus of claim 16, wherein the RF power from the first RF generator is applied to at least one coil disposed on the lid.

18. The apparatus of claim 6, wherein the control means stops the application of the RF power from the first RF generator after the introduction of the film formation gas is stopped.

* * * * *